United States Patent
Tachibana

(10) Patent No.: US 12,387,939 B2
(45) Date of Patent: Aug. 12, 2025

(54) SUBSTRATE PROCESSING METHOD

(71) Applicant: Tokyo Electron Limited, Tokyo (JP)

(72) Inventor: Kouzou Tachibana, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 343 days.

(21) Appl. No.: 17/757,026

(22) PCT Filed: Dec. 3, 2020

(86) PCT No.: PCT/JP2020/044980
§ 371 (c)(1),
(2) Date: Jun. 8, 2022

(87) PCT Pub. No.: WO2021/124900
PCT Pub. Date: Jun. 24, 2021

(65) Prior Publication Data
US 2023/0023792 A1 Jan. 26, 2023

(30) Foreign Application Priority Data
Dec. 16, 2019 (JP) ................................. 2019-226490

(51) Int. Cl.
*H01L 21/306* (2006.01)
*H01L 21/311* (2006.01)
*H01L 21/67* (2006.01)

(52) U.S. Cl.
CPC .... *H01L 21/31111* (2013.01); *H01L 21/6708* (2013.01)

(58) Field of Classification Search
CPC ......... H01L 21/02041; H01L 21/02019; H01L 21/30604
See application file for complete search history.

(56) References Cited

U.S. PATENT DOCUMENTS

| | | | | |
|---|---|---|---|---|
| 6,632,292 | B1 * | 10/2003 | Aegerter | H01L 21/67017 134/28 |
| 2013/0074872 | A1 * | 3/2013 | Yeh | H01L 21/67051 134/36 |

FOREIGN PATENT DOCUMENTS

WO 2018079494 A 7/2019

\* cited by examiner

*Primary Examiner* — Thomas T Pham
(74) *Attorney, Agent, or Firm* — Armstrong Teasdale LLP

(57) ABSTRACT

A substrate processing method includes: a first etching step of performing a first etching by supplying an etching liquid on a front surface of a substrate while rotating the substrate, wherein the first etching is performed under a condition in which a second etching amount of an etching target film in a second region on a peripheral edge of the front surface, is greater than a first etching amount of the etching target film in a first region on a center side of the front surface; and a second etching step of performing a second etching by supplying the etching liquid to the front surface of the substrate while rotating the substrate, wherein the second etching is performed under a condition in which the second etching amount of the etching target film in the second region of the front surface of the substrate is smaller than the first etching amount of the etching target film in the first region.

9 Claims, 6 Drawing Sheets

SUBSTRATE PROCESSING METHOD

CROSS-REFERENCE TO RELATED APPLICATIONS

The present application is a U.S. National Stage Entry of International Patent Application No. PCT/JP2020/044980, filed Dec. 3, 2020, which claims the benefit of priority to Japanese Patent Application No. 2019-226490, filed Dec. 16, 2019, each of which is hereby incorporated herein by reference in its entirety.

TECHNICAL FIELD

The present disclosure relates to a substrate processing method.

BACKGROUND

Manufacturing of a semiconductor device includes an etching step of wet-etching a thin film formed on the front surface of a substrate such as a semiconductor wafer. Patent Document 1 discloses an etching method of etching a thin film having a thick film thickness distribution at a peripheral edge portion. This etching method includes a first step of etching a film in the outer peripheral portion by supplying an etching liquid to the film formed in the outer peripheral portion and having a thickness greater than that in the central portion while rotating the substrate, and supplying, to the center side of the substrate with respect to the position at which the etching liquid is supplied, an etching inhibition liquid that inhibits etching of the film by the etching liquid, and a second step of supplying the etching liquid to the rotating substrate to perform etching to a preset film thickness after the first step. According to this method, a uniform film thickness distribution can be obtained after etching.

PRIOR ART DOCUMENT

Patent Document

Patent Document 1: International Publication WO 2018/079494 Pamphlet

The present disclosure provides a technique capable of making an etching amount distribution of an entire substrate uniform while ensuring a high etching rate as a whole.

SUMMARY

An embodiment of a substrate processing method includes: a first etching step of performing etching by supplying an etching liquid on a front surface of the substrate while rotating the substrate, wherein the etching is performed under a condition in which an etching amount of an etching target film in a second region, which is a region on a peripheral edge side of the front surface of the substrate, is greater than an etching amount of the etching target film in a first region, which is a region on a center side of the front surface of the substrate; and a second etching step of performing etching, after the first etching step, by supplying the etching liquid to the front surface of the substrate while rotating the substrate, wherein the etching is performed under a condition in which the etching amount of the etching target film in the second region of the front surface of the substrate is smaller than the etching amount of the etching target film in the first region of the front surface of the substrate. The first etching step is performed prior to the second etching step, and the second etching step is performed under a condition in which, by supplying a temperature control liquid to a central portion of a rear surface of the substrate, a temperature of the substrate is higher than that in a case in which the temperature control liquid is not supplied, and the temperature of the first region of the front surface of the substrate becomes higher than the temperature of the second region as the temperature control liquid spreads toward the peripheral edge of the substrate while losing heat to the substrate.

According to the above-described embodiment, it is possible to make an etching amount distribution of an entire substrate uniform while ensuring a high etching rate as a whole.

DETAILED DESCRIPTION

An embodiment of a substrate processing apparatus will be described with reference to the accompanying drawings.

Figure 1:
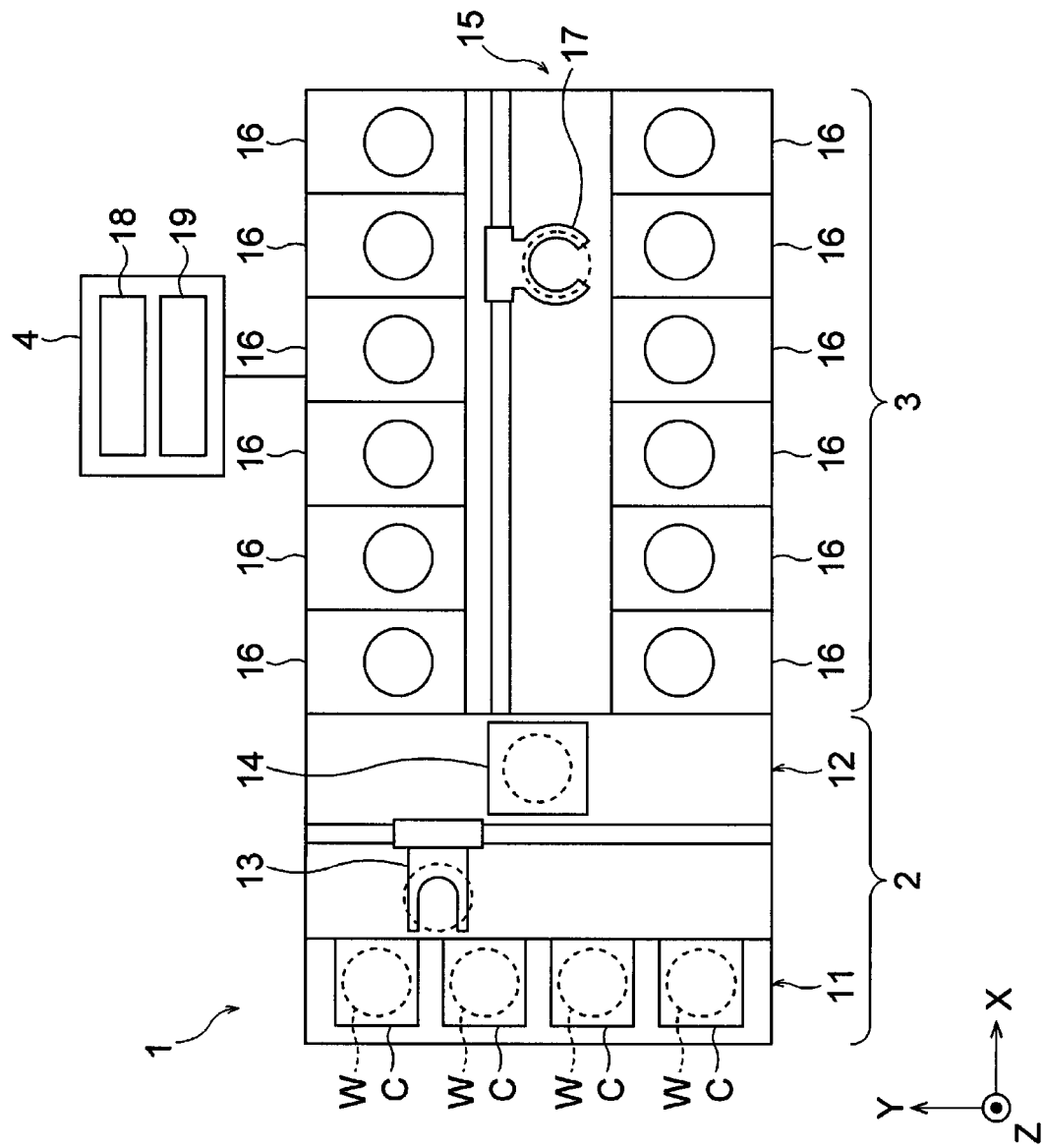
FIG. 1 is a horizontal cross-sectional view of a substrate processing apparatus according to an embodiment.

FIG. 1 is a schematic view illustrating a configuration of a substrate processing system according to the present embodiment. In the following description, in order to clarify a positional relationship, an X axis, a Y axis, and a Z axis which are orthogonal to each other are defined, and the Z-axis positive direction is defined as a vertical upward direction.

As illustrated in FIG. 1, a substrate processing system 1 includes a carry-in/out station 2, and a processing station 3. The carry-in/out station 2 and the processing station 3 are provided adjacent to each other.

The carry-in/out station 2 includes a carrier placement part 11 and a transfer part 12. A plurality of carriers C that accommodate a plurality of substrates, which are semiconductor wafers (hereinafter, referred to as "wafers W") in the present embodiment, in a horizontal posture, are placed in the carrier placement part 11.

The transfer part 12 is provided adjacent to the carrier placement part 11 and includes therein a substrate transfer device 13 and a delivery part 14. The substrate transfer device 13 includes a wafer holding mechanism configured to hold a wafer W. In addition, the substrate transfer device 13 is capable of moving in the horizontal direction and the vertical direction and rotating about the vertical axis, and transfers wafers W between the carriers C and the delivery part 14 using the wafer holding mechanism.

The processing station 3 is provided adjacent to the transfer part 12. The processing station 3 includes a transfer part 15 and a plurality of processing units 16. The plurality of processing units 16 are arranged side by side on opposite sides of the transfer part 15.

The transfer part 15 includes a substrate transfer device 17 provided therein. The substrate transfer device 17 includes a wafer holding mechanism configured to hold the wafer W. In addition, the substrate transfer device 17 is capable of moving in the horizontal direction and the vertical direction and rotating about the vertical axis, and transfers wafers W between the delivery part 14 and the processing units 16 using the wafer holding mechanism.

Each processing unit 16 performs predetermined substrate processing on the wafer W transferred thereto by the substrate transfer device 17.

In addition, the substrate processing system 1 includes a control device 4. The control device 4 is, for example, a computer, and includes a controller 18 and a storage 19. The storage 19 stores programs for controlling various processes executed in the substrate processing system 1. The controller 18 controls the operation of the substrate processing system 1 by reading and executing the programs stored in the storage 19.

In addition, these programs may be stored in a non-transitory computer-readable storage medium, and may be installed in the storage 19 of the control device 4 from the storage medium. The computer-readable storage medium is, for example, a hard disk (HD), a flexible disk (FD), a compact disk (CD), a magneto-optical disk (MO), a memory card, or the like.

In the substrate processing system 1 configured as described above, first, the substrate transfer device 13 of the carry-in/out station 2 takes out the wafer W from a carrier C placed on the carrier placement part 11 and places the taken-out wafer W on the delivery part 14. The wafer W placed on the delivery part 14 is taken out from the delivery part 14 by the substrate transfer device 17 in the processing station 3 and carried into a processing unit 16.

After being processed by the processing unit 16, the wafer W carried into the processing unit 16 is carried out from the processing unit 16 and placed on the delivery part 14 by the substrate transfer device 17. The processed wafer W placed on the delivery part 14 is returned to the carrier C in the carrier placement part 11 by the substrate transfer device 13.

Figure 2:
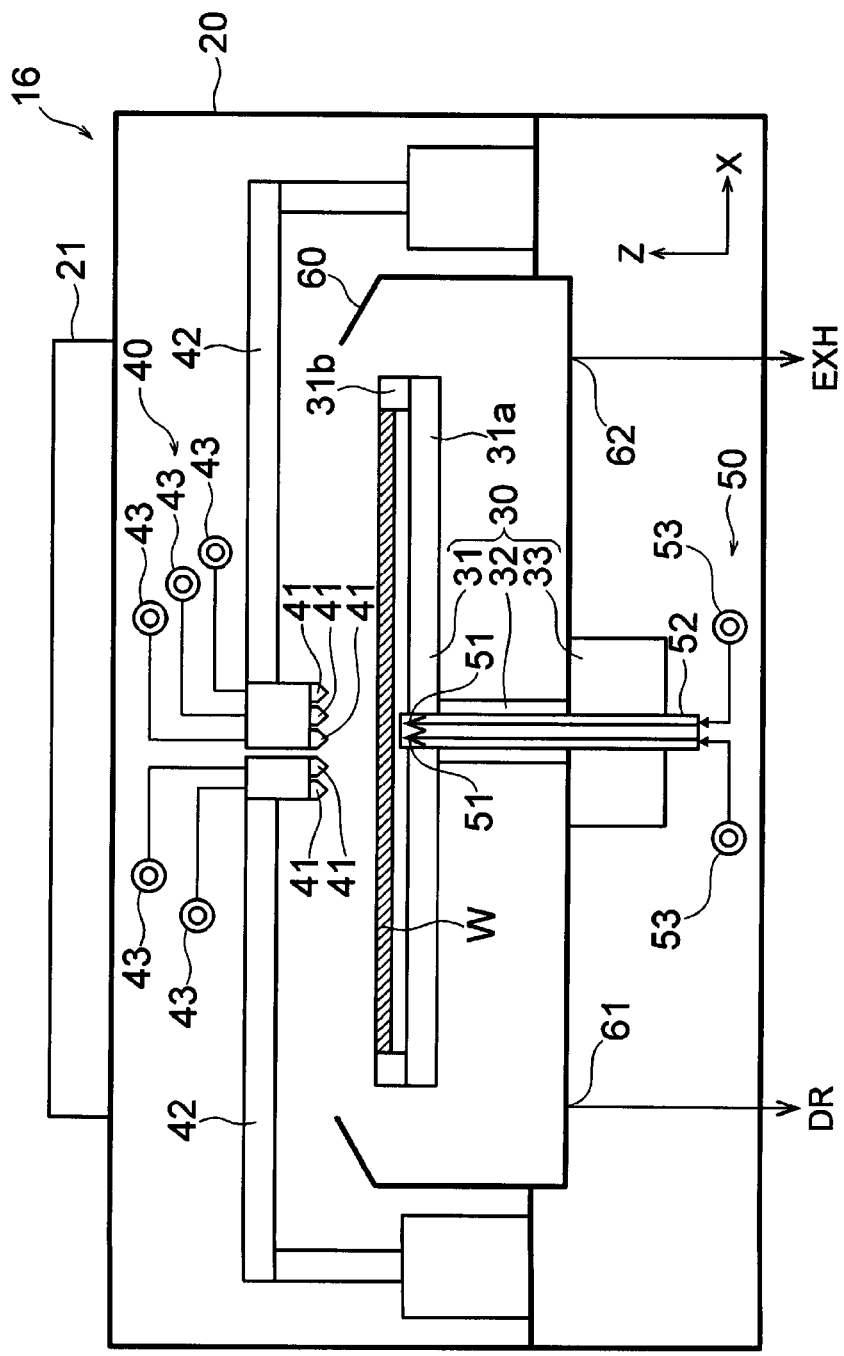
FIG. 2 is a schematic vertical cross-sectional view illustrating a configuration of a processing unit.

Next, a configuration of the processing unit 16 will be described with reference to FIG. 2.

The processing unit 16 includes a chamber 20, a substrate holding/rotating mechanism 30, a first processing fluid supplier 40, a second processing fluid supplier 50, and a recovery cup 60.

The chamber 20 accommodates the substrate holding/rotating mechanism 30 and the recovery cup 60. The ceiling of the chamber 20 is provided with a fan filter unit (FFU) 21. The FFU 21 forms a down-flow within the chamber 20.

The substrate holding/rotating mechanism 30 includes a substrate holder 31, a support column 32, and a rotary driver 33. The substrate holder 31 is configured as a mechanical chuck including a disk-shaped base 31a and a plurality of gripping claws 31b provided on the outer peripheral edge portion of the base 31a at intervals in the circumferential direction. The substrate holder 31 holds the wafer W horizontally by the gripping claws 31b. When the gripping claws 31b grip the wafer W, a gap is formed between the top surface of the base 31a and the bottom surface of the wafer W.

The support column 32 is a hollow member extending in the vertical direction. The upper end of the support column 32 is connected to the base 31a. When the rotary driver 33 rotates the support column 32, the substrate holder 31 and the wafer W held by the substrate holder 31 rotate around the vertical axis.

The recovery cup 60 is disposed to surround the substrate holder 31. The recovery cup 60 collects a processing liquid that is scattered from the wafer W held and rotated on the substrate holder 31. A drain port 61 is formed in the bottom portion of the recovery cup 60. The processing liquid collected by the recovery cup 60 is discharged outward of the processing unit 16 from the drain port 61. An exhaust port 62 is formed in the bottom portion of the recovery cup 60. An internal space of the recovery cup 60 is suctioned through the exhaust port 62. The gas supplied from the FFU 21 is drawn into the interior of the recovery cup 60 and then discharged outward of the processing unit 16 through the exhaust port 62.

The first processing fluid supplier 40 supplies various processing fluids (liquid, gas, gas-liquid mixed fluid, etc.) to the top surface of the wafer W held by the substrate holder 31 (usually the front surface of the wafer W on which devices are formed). The first processing fluid supplier 40 includes one or more front surface nozzles 41 that eject processing fluids toward the top surface (a first surface) of the wafer W. The number of front surface nozzles 41 is provided as many as necessary for performing processing executed by the processing unit 16. Although five front surface nozzles 41 are illustrated in FIG. 2, the number is not limited thereto.

The first processing fluid supplier 40 includes one or more (two in the illustrated example) nozzle arms 42. Each nozzle arm 42 supports at least one of the plurality of front surface nozzles 41. Each nozzle arm 42 may move the supported front surface nozzle 41 between a position substantially directly above the rotational center of the wafer W (a processing position) and a retracted position outside the upper end opening of the recovery cup 60.

A processing fluid is supplied to each of the front surface nozzles 41 from a corresponding processing fluid supply mechanism 43. The processing fluid supply mechanism 43 may include a processing fluid source such as a tank, a bomb, and a factory resource, a supply pipeline that supplies a processing fluid (a processing liquid or a processing gas) from the processing fluid source to the front surface nozzle 41, an opening/closing valve provided in the supply pipeline, and a flow rate control device such as a flow rate control valve. A drain pipeline may be connected to the supply pipeline in order to discharge the processing fluid (particularly a processing liquid) remaining in the front surface nozzle 41 and the supply pipeline in the vicinity of the same. Such a processing fluid supply mechanism 43 is widely known in the technical field of semiconductor manufacturing equipment, and the illustration and detailed description of the structure are omitted. The processing unit 16 is provided with a liquid receiving part (not illustrated) so that dummy dispense is possible when each front surface nozzle 41 is at the retracted position.

The second processing fluid supplier 50 supplies various processing fluids (a processing liquid, a processing gas, etc.) to the lower surface of the wafer W (usually the rear surface of the wafer W on which no device is formed) held by the substrate holder 31. The second processing fluid supplier 50 includes one or more (two in the illustrated example) rear surface nozzles 51 that eject a processing fluid toward the lower surface (a second surface) of the wafer W. As schematically illustrated in FIG. 2, a processing liquid supply pipe 52 extends in the vertical direction inside the hollow support column 32. The upper end opening of each of two flow paths extending in the vertical direction in the processing liquid supply pipe 52 serves as the rear surface nozzle 51. The processing liquid supply pipe 52 is installed inside the support column 32 to be capable of maintaining the non-rotating state even when the substrate holder 31 and the support column 32 are rotating.

A processing fluid is supplied to each of the rear surface nozzles 51 from a corresponding processing fluid supply mechanism 53. The processing fluid supply mechanism 53 has the same configuration as the processing fluid supply mechanism 43 for the above-described front surface nozzle 41.

Next, each step of liquid processing performed on one wafer W using the processing unit 16 will be described. Here, it is assumed that an etching target film formed on the front surface of the wafer W is an oxide film (a thermal oxide film or a TEOS). Then, in executing each step of the following liquid processing, as the one or more front surface nozzles, a bi-fluid nozzle that ejects a mixed fluid of dilute hydrophobic acid (DHF) and nitrogen gas ($N_2$ gas) as an etching liquid (hereinafter, referred to as a "bi-fluid nozzles 41A") and two DIW nozzles (hereinafter referred to as "DIW nozzle 41B" and "DIW nozzle 41C") are used.

In addition, in executing each step of the following liquid processing, as the one or more nozzle arms 42, a first nozzle arm (hereinafter, referred to as a "first nozzle arm 42A") and a second nozzle arm (hereinafter referred to as a "second nozzle arm 42B") are used.

Furthermore, in carrying out each step of the following liquid processing, as the one or more rear surface nozzles 51, a rear surface liquid nozzle that selectively ejects one of DHF and DIW (hereinafter, referred to as "rear surface liquid nozzle 51A") and a rear surface gas nozzle that ejects the $N_2$ gas (hereinafter, referred to as a "rear surface gas nozzle 51B") are used.

The bi-fluid nozzle 41A is configured to mist a processing liquid by making the flow of the processing liquid (e.g., DHF as an etching liquid) merge with the flow of a gas (e.g., the $N_2$ gas) in the nozzle and eject a bi-fluid consisting of a mixture of the droplets of the processing liquid and the gas. When the gas is not supplied to the bi-fluid nozzle 41A, the bi-fluid nozzle 41A functions as a normal nozzle that ejects only the processing liquid in the form of a liquid column. Such a bi-fluid nozzle itself is well known in the art and a detailed description of its structure will be omitted.

Pre-Wetting Step

While the wafer W is being rotated at a high speed (e.g., about 1,000 rpm), the DIW nozzle 41B is located above the center of the wafer W, and pure water (DIW) at room temperature (e.g., about 25 degrees C.) is ejected to land on the central portion of the front surface of the wafer W. In the case of ejecting a liquid, "ejecting the liquid to land on the central portion" means that at least the rotational center of the front surface of the wafer W may be wetted by the ejected liquid. Further, DIW at room temperature (e.g., about 25 degrees C.) is ejected from the rear surface liquid nozzle 51A to the central portion of the rear surface of the wafer W. The DIW supplied to the central portions of the front surface and the rear surface of the wafer W spreads over the entire front surface and rear surface by a centrifugal force, and the entire front surface and rear surface are covered with a DIW liquid film. Thereafter, the rotating speed of the wafer W is reduced to a low speed (e.g., about 200 rpm). Thereafter, the ejection of DIW from the DIW nozzle 41B and the rear surface liquid nozzle 51A is stopped.

The DIW nozzle 41B supported on the first nozzle arm 42A retracts from above the central portion of the wafer W and is located above the peripheral edge portion of the wafer W, and instead of the DIW nozzle 41B, the DIW nozzle 41C supported on the second nozzle arm 42B is located above the central portion of the wafer W.

The rotating speed of the wafer W is maintained at a low speed of 300 rpm or less, for example, about 200 rpm, until the second etching step to be described later is terminated after first reducing the rotating speed of the wafer. The rotating speed of the wafer W is maintained constant until the second etching step is terminated, but may be slightly changed. By keeping the rotating speed of the wafer W low, it is possible to prevent a dried region from being formed on the front surface the wafer W even when the amount of liquid supplied to the front surface of the wafer W is small (the ejection flow rate of the liquid from the bi-fluid nozzle is, for example, about 0.1 L/min).

First Etching Step

Figure 3A:
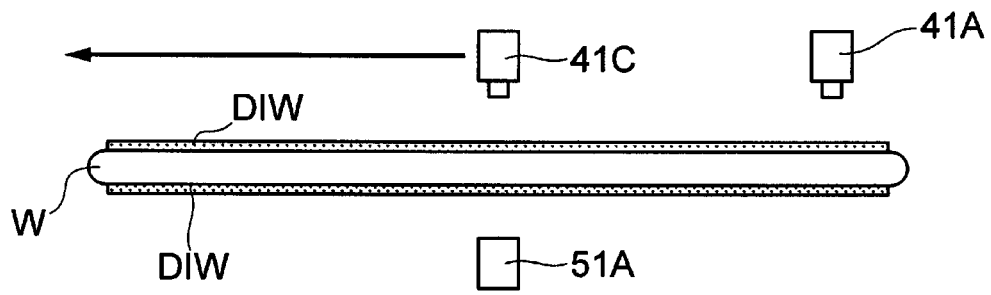
FIG. 3A is an operation diagram for explaining a step of substrate processing.

Subsequently, DIW at room temperature (e.g., about 23 degrees C.) is ejected from the DIW nozzle 41C to the central portion of the front surface of the wafer W. As a result, a DIW liquid film formed on the entire front surface of the wafer W is continuously and reliably maintained. The ejection of DIW is stopped in a short period of time (e.g., less than 1 second). A state immediately after that is illustrated in FIG. 3A. Thereafter, the DIW nozzle 41C retracts from above the wafer W.

The liquid film of DIW plays a role of a protective film for preventing unintended etching from occurring in a first region to be described later when the mists of DHF ejected from the bi-fluid nozzle 41A adheres to the first region, or preventing particles from being generated in the first region. The first region is a circular region inside the radial position R3 on the front surface of the wafer W, which will be described later. Therefore, even when the a bi-fluid is ejected from the bi-fluid nozzle 41A to the peripheral edge portion of the wafer W, a small amount of DIW may be continuously ejected from the DIW nozzle 41C. However, when a thick DIW liquid film is present in a second region (a circular region outside the radial position R3) to be described later when the bi-fluid is ejected from the bi-fluid nozzle 41A to the peripheral edge portion of the wafer W, the etching effect by the bi-fluid may be impaired. Therefore, when it is guaranteed that the first region is continuously covered with a liquid film, a small ejection flow rate is preferable even when the DIW is continuously ejected from the DIW nozzle 41C. When the liquid film of DIW supplied in the previous pre-wetting step is sufficiently maintained in the first region when the bi-fluid is ejected from the bi-fluid nozzle 41A to the second region of the wafer W, the ejection of DIW from the DIW nozzle may be omitted.

Figure 3B:
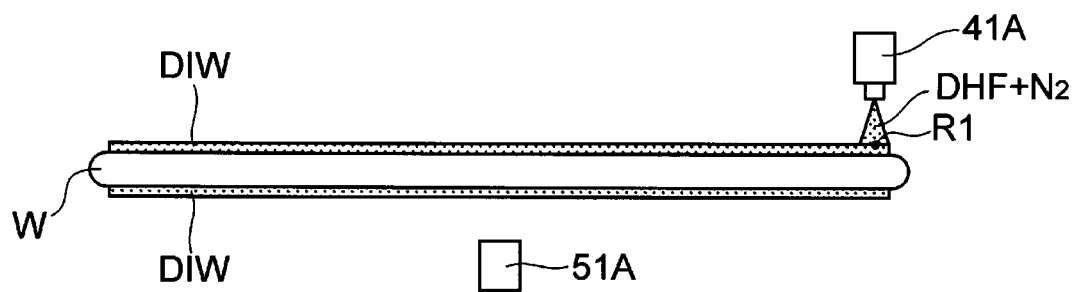
FIG. 3B is an operation diagram for explaining a step of substrate processing.

Subsequently, DHF is ejected from the bi-fluid nozzle 41A supported on the first nozzle arm 42A toward the peripheral edge portion of the wafer W, specifically, a radial position slightly inside the peripheral edge (edge) of the wafer W (hereinafter, this radial position will be referred to as a "radial position R1"). Thereafter, a $N_2$ gas is supplied to the bi-fluid nozzle 41A in addition to the DHF, whereby a bi-fluid which is a mixed fluid of the mists of the DHF and the $N_2$ gas is ejected toward the radial position R1. A state immediately after that is illustrated in FIG. 3B. Since the bi-fluid is ejected from the bi-fluid nozzles 41A in a conical shape, that is, with a certain width, the bi-fluid also collides with the edge of the wafer W. A flow rate of the DHF supplied to the bi-fluid nozzle 41A may be, for example, 0.1 L/min, but is not limited thereto.

Almost at the same time when the supply of the $N_2$ gas to the bi-fluid nozzle 41A is initiated (may be slightly before or slightly after), ejection of a temperature control liquid at a first temperature (e.g., about 25 degrees C.) (in the present example, DHF which also has a role as a cleaning chemical liquid) is initiated from the rear surface liquid nozzle 51A. The DHF ejected from the rear surface liquid nozzle 51A spreads toward the edge of the rear surface of the wafer W, so that the entire rear surface of the wafer W is covered with the liquid film of the DHF. An ejection flow rate of the temperature control liquid may be, for example, 1.5 L/min, but is not limited thereto. The ejection of DHF from the rear surface liquid nozzle 51A is continued until the first etching step is terminated.

Figure 3C:
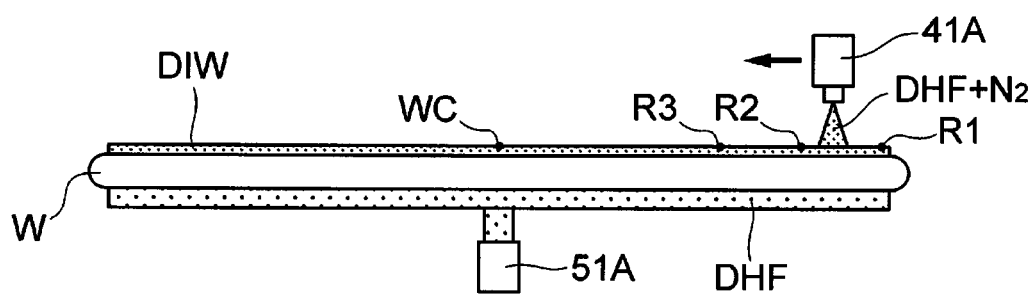
FIG. 3C is an operation diagram for explaining a step of substrate processing.

Subsequently, while the bi-fluid is being ejected from the bi-fluid nozzle 41A, the bi-fluid nozzle 41A is moved at a first moving speed to approach the rotational center WC of the wafer W. That state is illustrated in FIG. 3C. The bi-fluid nozzle 41A moves to a position at which the bi-fluid is ejected toward the radial position R2 inside the radial position R1.

Subsequently, while continuously ejecting the bi-fluid from the bi-fluid nozzle 41A, the bi-fluid nozzle 41A is continuously moved at a second moving speed higher than the first moving speed to approach the rotational center of the wafer W. The bi-fluid nozzle 41A moves to a position at which the bi-fluid is ejected toward the radial position R3 inside the radial position R2, and then the ejection of the bi-fluid from the bi-fluid nozzle 41A is stopped. Thereafter, the bi-fluid nozzle 41A moves to a position above the rotational center of the wafer W.

The radial position R1 is closest to the peripheral edge of the wafer W among the radial position R1, the radial position R2, and the radial position R3. The radial position R3 is closest to a center of the substrate among the radial position R1, the radial position R2, and the radial position R3. When the radial position of the rotational center of the wafer W is indicated as 0 (zero) mm and the radial position of the edge of the wafer W is indicated as 150 mm, the radial position R1 is, for example, 146 mm, the radial position R2 is, for example, 100 mm, and the radial position R3 is, for example, 75 mm (but not limited to these values). The first moving speed is, for example, 15 mm/sec, and the first moving speed is, for example, 150 mm/sec (not limited to these values).

By this first etching step, a ring-shaped region outside the radial position R3 on the front surface of the wafer W is etched. The circular region from the rotational center of the wafer W to the radial position R3 is not etched.

Figure 4:
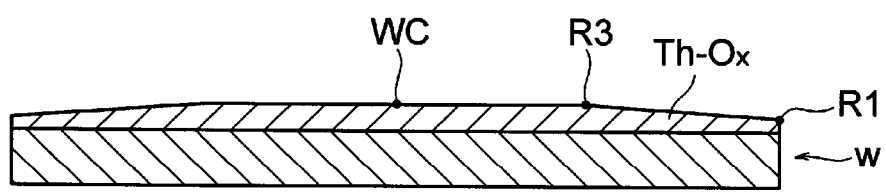
FIG. 4 is a schematic cross-sectional view for explaining a film thickness distribution of an etching target film after a first etching step.

Specifically, the region outside the radial position R2 on the front surface of the wafer W is etched relatively heavily by the first etching step, and the region between the radial positions R3 and R2 is etched relatively weakly. Since the time of contact with the DHF increases toward the outside in the radial direction of the wafer W, an oxide film, which is the etching target film, is greatly scraped toward the edge of the wafer W, as schematically illustrated in FIG. 4.

As will be described later, the ultimate purpose of the present embodiment is to make the sum of the etching amount by the first etching step and the etching amount by the second etching step substantially constant over the entire surface of the wafer W regardless of the position in the radial direction. As long as the first etching step is executed to be able to achieve this purpose, the conditions of the first etching step are not limited to those described above. For example, the moving speed of the bi-fluid nozzle 41A may be constant in the entire first etching step. Alternatively, the moving speed of the bi-fluid nozzle 41A may be further changed in multiple steps, or may be changed without steps.

The DHF ejected from the bi-fluid nozzle 41A is in the form of mists (fine droplets) and is easily vaporized, so that the temperature thereof is likely to drop. For example, when DHF at about 25 degrees C. is supplied to the bi-fluid nozzle 41A, the temperature at the moment when the DHF mists ejected from the bi-fluid nozzle land on the front surface of the wafer (hereinafter, for convenience, referred to as "bi-fluid temperature at the time of landing") is lowered to, for example, about 18 degrees C. Therefore, the wafer W is cooled by the bi-fluid, and as a result, the etching rate is lowered. However, since the DHF having a temperature (e.g., about 25 degrees C.) higher than the bi-fluid temperature at the time of landing (e.g., about 18 degrees C.) covers the entire rear surface of the wafer W, the temperature drop of the wafer W is suppressed. Therefore, the decrease in the etching rate on the front surface of the wafer W due to the DHF ejected from the bi-fluid nozzle 41A is also suppressed so that the increase in the time required for the first etching step can be prevented.

When the first etching step is terminated, the ejection of the temperature control liquid (DHF) from the rear surface liquid nozzle 51A is temporarily stopped. In addition, the ejection of the bi-fluid (DHF+$N_2$ gas) from the bi-fluid nozzle 41A is also temporarily stopped, and the bi-fluid nozzle 41A is moved to a position above the rotational center of the wafer W. A period for stopping the ejection of the temperature control liquid from the rear surface liquid nozzle 51A and a period for stopping the ejection of the bi-fluid from the bi-fluid nozzle 41A are short enough that no dried region occurs on the front surface and the rear surface of the wafer W.

Second Etching Step

Subsequently, DHF is ejected from the bi-fluid nozzle 41A toward the rotational center WC of the wafer W. Thereafter, the $N_2$ gas is supplied to the bi-fluid nozzle 41A in addition to the DHF, whereby a bi-fluid which is a mixed fluid of the mists of the DHF and the $N_2$ gas is ejected toward the central portion of the wafer W. A flow rate of the DHF supplied to the bi-fluid nozzle 41A may be, for example, 0.1 L/min, but is not limited thereto.

Almost at the same time when the supply of the $N_2$ gas to the bi-fluid nozzle 41A is initiated (may be slightly before or slightly after), ejection of a temperature control liquid at a first temperature (e.g., about 25 degrees C.) (in the present example, DHF which also has a role as a cleaning chemical liquid) is initiated from the rear surface liquid nozzle 51A so that the rear surface of the wafer W is covered with the temperature control liquid. An ejection flow rate of the temperature control liquid may be, for example, 1.5 L/min, but is not limited thereto. The ejection of DHF from the rear surface liquid nozzle 51A is continued until the second etching step is terminated.

Figure 3D:
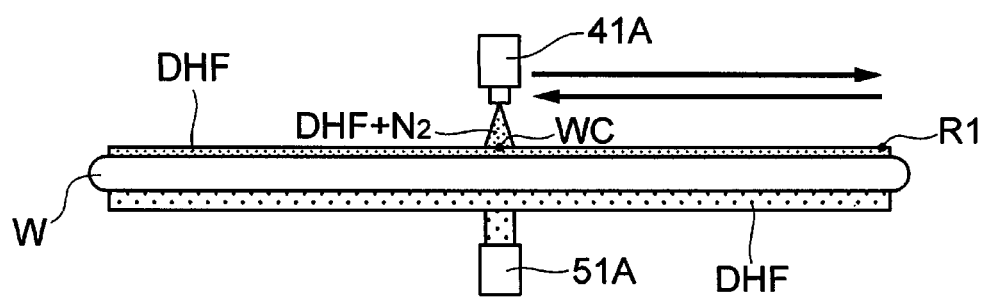
FIG. 3D is an operation diagram for explaining a step of substrate processing.

While ejecting the bi-fluid, the bi-fluid nozzle 41A moves from the first position at which the bi-fluid is ejected toward the rotational center Wc of the front surface of the wafer W to the second position at which the bi-fluid is ejected toward the radial position R1 of the front surface of the wafer W. A state at this time is illustrated in FIG. 3D. The bi-fluid nozzle 41A temporarily may stop the ejection of the bi-fluid after moving from the first position to the second position and may then return to the first position and initiate the ejection of the bi-fluid at the first position, and the operation of moving from the first position to the second position may be repeated a plurality of times. Instead of this, the bi-fluid nozzle 41A may reciprocate a plurality of times between the first position and the second position while ejecting the bi-fluid. As a result, the etching target film on the front surface of the wafer W is etched. When the moving speed of the bi-fluid nozzle 41A is too low, a dried region may occur near the rotational center of the wafer W, especially when the bi-fluid nozzle 41A is at the second position. Therefore, the moving speed of the bi-fluid nozzle 41A is set so that such an event does not occur.

The ejection of the temperature control liquid (DHF) from the rear surface liquid nozzle 51A may be continued, but may be interrupted in the middle of the second etching step when a dried region does not occur on the rear surface of the wafer W. For example, when the ejection of the bi-fluid from the bi-fluid nozzle 41A is temporarily stopped and the bi-fluid nozzle 41A is returned from the second position to the first position, the ejection of the temperature control liquid from the rear surface liquid nozzle 51A is stopped. As described above, it is also possible to adjust the temperature distribution of the wafer W by using the temporary interruption of the ejection of the temperature control liquid from the rear surface liquid nozzle 51A. It is also possible to adjust the temperature distribution of the wafer W by changing the ejection flow rate of the temperature control liquid from the rear surface liquid nozzle 51A during the ejection.

Figure 5:
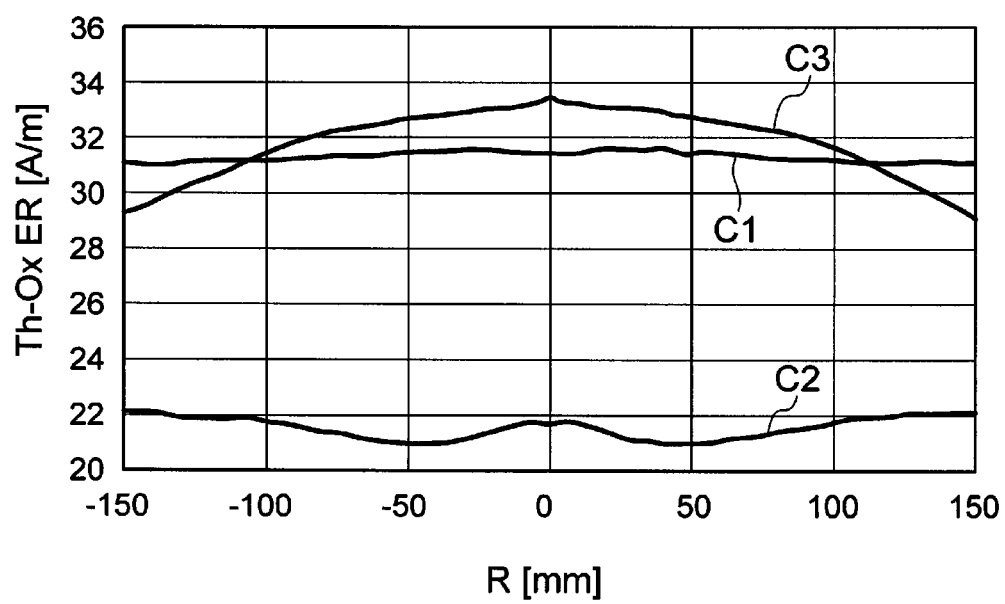
FIG. 5 is a graph for explaining an etching amount distribution.
Figure 6A:
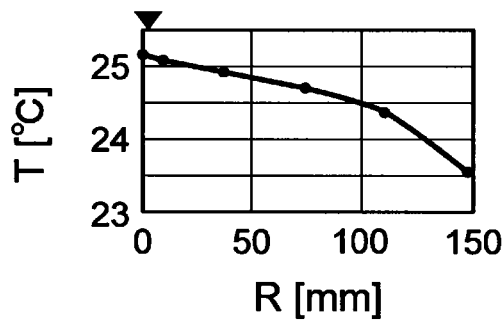
FIGS. 6A to 6E are graphs showing changes over time in a temperature distribution of a wafer while a second etching step is being executed.
Figure 6B:
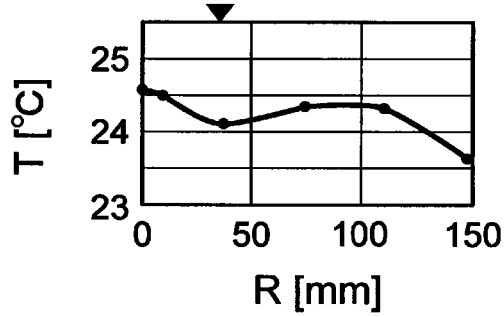
Figure 6C:
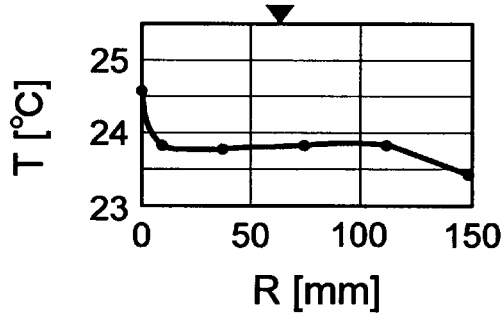
Figure 6D:
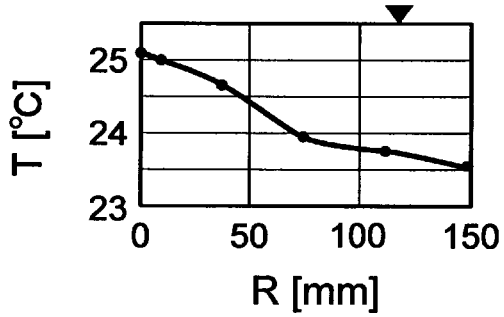
Figure 6E:
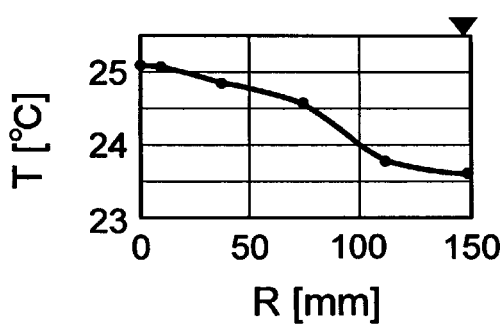

The etching amount distribution in the second etching step will be described with reference to a graph of FIG. 5 while comparing with a comparative example. In the graph of FIG. 5, the horizontal axis represents the radial position R on the front surface of the wafer W (0 mm is the rotational center, and 150 mm is the edge), and the vertical axis represents the etching rate (Th-Ox ER) (the unit is angstrom/min) of oxide film (Th-Ox).

In Comparative Example 1 (see curve C1 in FIG. 5), DHF at 25 degrees C. was continuously supplied only to the rotational center of the surface of the wafer at a flow rate of 1.5 L/min, and as the temperature control liquid, DIW at 25 degrees C. was continuously supplied to the rotational center of the rear surface of the wafer at a flow rate of 1.0 L/min. The average etching rate was 31.3 angstroms/min, and the etching rate range (the difference between the maximum and minimum values) was 0.7 angstroms/min. The in-plane uniformity of the etching rate was high. Although not shown in the graph of FIG. 5, it has been found in Comparative Example 1 that the etching rate and the distribution of the same are almost unchanged even if the temperature control liquid is not supplied to the rear surface of the wafer.

In Comparative Example 2 (see curve C2 in FIG. 5), the bi-fluid was continuously supplied to the front surface of the wafer while reciprocating the ejection position of the bi-fluid (DHF+$N_2$ gas) between the center and the peripheral edge of the wafer. In addition, the temperature control liquid was not supplied to the rear surface of the wafer. The supply flow rate of DHF to the bi-fluid nozzle was 0.1 L/min. The bi-fluid temperature at the time of landing was 18 degrees C. The average etching rate was 21.6 angstroms/min. The etching rate range in Comparative Example 2 was 1.2 angstroms/min, and the in-plane uniformity of the etching rate was lower than that of Comparative Example 1.

In the example of the second etching step (see curve C3 in FIG. 5), the bi-fluid was continuously supplied while reciprocating the position of ejecting of the bi-fluid (DHF+$N_2$ gas) from the bi-fluid nozzle between the center and the peripheral edge of the wafer, and DIW at 25 degrees C. was continuously supplied to the rotational center of the rear surface of the wafer as the temperature control liquid at a flow rate of 1.5 L/min. The bi-fluid temperature at the time of landing was 18 degrees C. The average etching rate was 31.9 angstroms/min. The etching rate range was 4.2 angstroms/min, and the in-plane uniformity of the etching rate was the lowest.

The example of the second etching step differs from Comparative Example 2 only in that the temperature control liquid at room temperature (about 25 degrees C.) was supplied to the central portion of the rear surface of the wafer. The temperature of the temperature control liquid is 25 degrees C., which is higher than the bi-fluid temperature at the time of landing, which is 18 degrees C. Therefore, since the temperature of the wafer rises as a whole compared with Comparative Example 2, the etching rate rises as a whole. The temperature control liquid supplied to the central portion of the rear surface of the wafer spreads toward the peripheral edge of the rear surface of the wafer while losing heat to the wafer cooled by the bi-fluid. Therefore, a temperature distribution in which the temperature near the rotational center of the wafer is the highest and the temperature decreases toward the edge of the wafer occurs.

The five graphs of FIGS. 6A to 6E show changes over time in the wafer surface temperature distribution in the example of the second etching step every 2 seconds. The horizontal axes represent the position R in the radial direction of the wafer (the distance (mm) from the rotational center WC), and the vertical axes represent the temperature T (degrees C.). The black triangles indicate the positions of the bi-fluid nozzle. It can be seen that after the portion of the wafer directly below the bi-fluid nozzle was cooled by the bi-fluid and after the bi-fluid nozzle passed, the temperature thereof rises due to the influence of the temperature control liquid supplied to the rear surface.

As shown in FIG. 5, in Comparative Example 2, the curve C2 showing the etching rate distribution was W-shaped (the etching rate at a position about 50 mm away from the center was the minimum), but in the example of the second etching step, the etching rate distribution was inverted U-shaped, and the W-shape did not appear. It is considered that this is because the heating effect by the temperature control liquid is considerably larger than the cooling effect of the bi-fluid.

From the above-described test results, the result of Comparative Example 2 is most preferable when only the etching rate (size and uniformity) is considered. However, by supplying the bi-fluid to the front surface of the wafer, particles, foreign substances, and the like that were adhered to the wafer surface before the etching process can be strongly removed by the physical energy (kinetic energy) of the bi-fluid. Therefore, there is a great advantage in that the cleanliness of the wafer after the etching process can be significantly improved.

Therefore, in the second etching step, the temperature control liquid is supplied to the rear surface of the wafer in order to cover a drawback associated with supplying the bi-fluid to the front surface of the wafer, that is, the decrease in the etching rate due to the cooling effect of the bi-fluid. In addition, in order to cover a drawback of non-uniformity in etching rate due to supplying the temperature control liquid to the central portion of the rear surface of the wafer (the etch rate in the central portion of the wafer is considerably higher than that in the peripheral edge portion), the first etching step of selectively etching the peripheral edge portion of the wafer is provided. In this way, by combining the first etching step and the second etching step, the uniformity of the etching rate in the wafer plane is raised to a level that does not cause any problem.

Further, the drawback of non-uniformity in etching rate associated with supplying the temperature control liquid to the central portion of the rear surface of the wafer may be solved by providing a so-called bar nozzle below the rear surface of the wafer (as is well known in the art, the bar nozzle is a rod-shaped nozzle that extends from below the center of the wafer to below the peripheral edge of the wafer, and is of a type that can supply liquid to different radial positions of the wafer under different conditions). Providing such a bar nozzle leads to an increase in the cost of the processing unit. Therefore, when it is necessary to supply liquid to the rear surface of the wafer W, it is common to supply the liquid from the tip end of a liquid supply pipe penetrating the hollow rotary shaft of a spin chuck to the rotational center of the rear surface of the wafer W or the vicinity of the rotational center. In the above-described embodiment, even when a processing unit having such a general configuration is used, it is possible to obtain a desired etching result merely by changing the operation method of the apparatus.

From the viewpoint of reducing the apparatus cost and the apparatus operating cost, it is most preferable to set the temperature of the temperature control liquid ejected from the rear surface liquid nozzle to room temperature in the second etching step. However, the temperature of the temperature control liquid may be at least higher than the bi-fluid temperature at the time of landing. The temperature of the temperature control liquid may be higher than normal temperature and, for example, about 30 degrees C.

Figure 7:
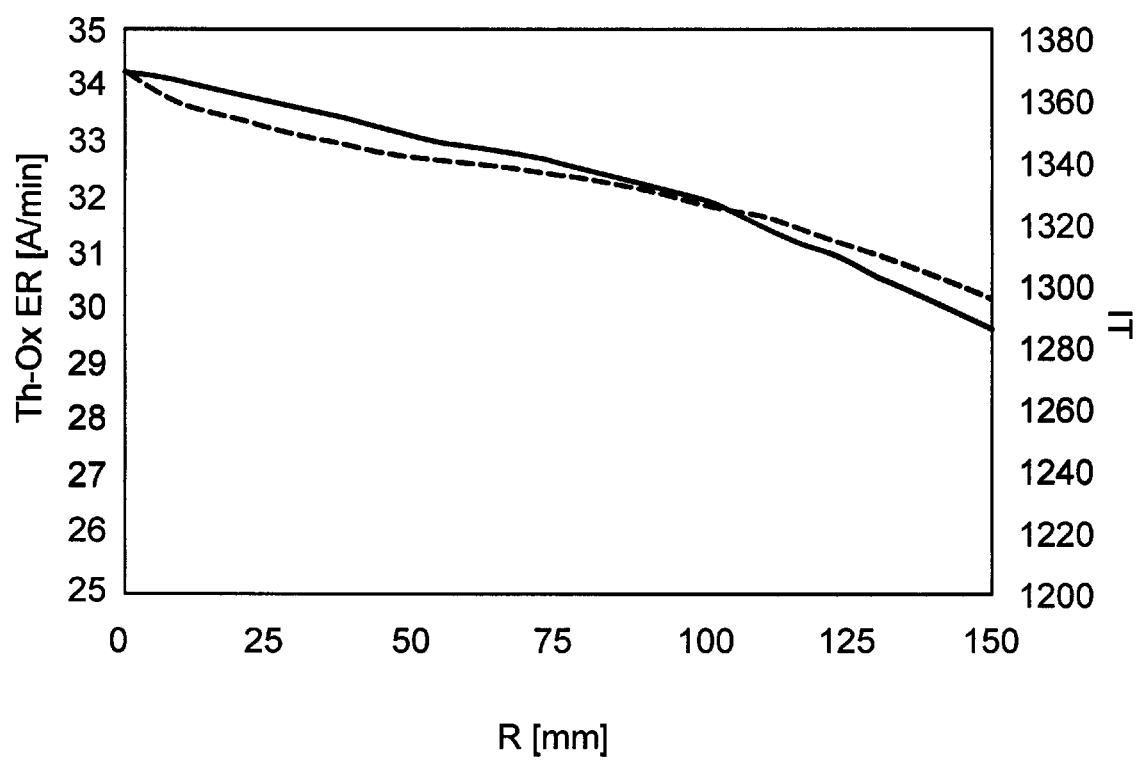
FIG. 7 is a graph illustrating a relationship between a wafer temperature distribution and an etching amount distribution.

The reference data related to the above-described embodiment will be described below. FIG. 7 is a graph showing experimental results of investigating a relationship between the etching amount distribution and the temperature distribution in the second etching step. The experiment was performed by reciprocating multiple times the bi-fluid nozzle 41A, which supplies a bi-fluid, between the rotational center of the wafer W and the above-mentioned radial position R1 while ejecting DIW at 25 degrees C. from the rear surface liquid nozzle 51A at 1.5 L/min. The horizontal axis represents the radial position (RP) of the front surface of the wafer W (0 mm is the rotational center, and 150 mm is the edge), the left vertical axis represents the etching rate (Th-Ox ER) (angstrom/min) of oxide film (Th-Ox), and the right vertical axis represents the time integral value (IT) of an actual temperature. The etching rates and the actual temperatures were measured at radial positions of 0 mm, 9 mm, 37 mm, 74 mm, 110 mm, and 147 mm. The solid line shows the etching rates, and the dotted line shows the time integral values of the actual temperatures. From FIG. 7, it is evident that the etching rate (that is, the etching amount) on the front surface of the wafer W is the largest in the central portion and decreases toward the peripheral edge portion, and that the etching amount distribution generally corresponds to the temperature distribution.

Hereinafter, the steps after the second etching step will be briefly explained.

Rinsing Step

When the ejection of a bi-fluid from the bi-fluid nozzle 41A and the ejection of DHF as the temperature control liquid from the rear surface liquid nozzle 51A in the second etching step are stopped and the second etching step is terminated, the rinsing step is performed. Specifically, for example, DIW as the rinsing liquid is ejected from the DIW nozzle 41C to the central portion of the front surface of the wafer W, and DIW is ejected from the rear surface liquid nozzle 51A to the rear surface of the wafer W. At this time, the rotation speed of the wafer W is increased to, for example, 1,000 rpm. As a result, a rinsing process is performed on the front surface and the rear surface of the wafer W.

Drying Step

Subsequently, the supply of DIW to the front surface and the rear surface of the wafer W is stopped, and the wafer W is continuously rotated at a high speed to shake off and dry the wafer W. As a result, the drying step is terminated, and a series of liquid processes for one wafer is completed. At this time, the $N_2$ gas may be ejected from the rear surface gas nozzle 51B.

In a modification, after the rinsing step, a substitution step of substituting the DIW on the front surface of the wafer W with a low surface tension and highly volatile organic solvent for drying, such as isopropyl alcohol (IPA), is performed, and then a drying step may be performed. In the drying step, a drying gas having a low oxygen concentration and a low humidity, such as nitrogen gas, may be supplied to the front surface of the wafer W. In this case, as the front surface nozzles 41 described above, an IPA nozzle and a $N_2$ nozzle may be further provided. In this case, the rinsing step and the drying step on the rear surface side of the wafer W may be the same as those described above.

OTHER EMBODIMENTS

The first etching step may be performed by moving (e.g., reciprocating) the bi-fluid nozzle 41A that is ejecting a bi-fluid (DHF+$N_2$) between the above-described first and second positions while causing a temperature control liquid at a low temperature to be ejected from the rear surface liquid nozzle 51A. In this case, the temperature of the temperature control liquid is set to be lower than the "bi-fluid temperature at the time of landing" of the bi-fluid from the bi-fluid nozzle 41A. The temperature control liquid at a low temperature ejected from the rear surface liquid nozzle 51A spreads toward the peripheral edge portion of the wafer W while taking heat away from the wafer W. Therefore, in contrast to the curve C3 in FIG. 5, a temperature distribution having a low central portion and a high peripheral edge portion occurs. As described above, since the etching amount distribution generally corresponds to the temperature distribution, an etching amount distribution similar to that of the above-described first etching step is obtained. In this case, the second etching step may be the same as the second etching step in the above-described embodiment, and in this case as well, the same effect as that of the above-described embodiment can be obtained.

The embodiments disclosed herein should be considered to be exemplary in all respects and not restrictive. The embodiments described above may be omitted, replaced, or modified in various forms without departing from the scope and spirit of the appended claims.

For example, the etching process of the wafer surface in the second etching step may be performed without using a bi-fluid (that is, with a chemical liquid in which a $N_2$ gas is not mixed). In the second etching step, the etching amount at the central portion of the wafer may be larger than the etching amount in the peripheral edge portion of the wafer, regardless of whether the chemical liquid supplied to the front surface of the wafer is a bi-fluid. For example, when the temperature of the temperature control liquid supplied to the central portion of the rear surface of the wafer is higher than the temperature of the chemical liquid supplied while moving the landing point on the front surface of the wafer in the radial direction of the wafer, such an etching amount distribution may occur. In addition, such an etching amount distribution may occur even when the flow rate of the temperature control liquid supplied to the central portion of the rear surface of the wafer is larger than the flow rate of the chemical liquid supplied to the front surface of the wafer. Even in such a case, it is useful to execute the first etching step under the condition of canceling the non-uniformity of the etching amount distribution in the second etching step.

For example, during a first half period of the second etching step, the bi-fluid nozzle 41A may be reciprocated from the central portion of the wafer to the peripheral edge portion while the bi-fluid is being ejected from the bi-fluid nozzle 41A, and during a second half period, DHF not containing the $N_2$ gas (not in the form of mists) may be supplied from the bi-fluid nozzle 41A. In this case, the bi-fluid nozzle 41A may be moved between the first position and the second position or may be fixed at the first position in the second half period.

DHF that has not been misted may be used as the etching liquid for at least one period of the first etching step.

The etching liquid is not limited to DHF, and any etching liquid having a temperature dependence on the etching rate may be used.

The substrate to be processed is not limited to a semiconductor wafer, but may be any of various substrates used in the semiconductor device manufacturing field, such as a glass substrate or a ceramic substrate.

What is claimed is:

1. A substrate processing method, comprising:
a first etching step of performing a first etching of a second region on a front surface of a substrate by ejecting an etching liquid by a nozzle from a first radial position to a third radial position via a second radial position between the first radial position and the third radial position and supplying a temperature control liquid to a central portion of a rear surface of the substrate while rotating the substrate, wherein after the first etching is completed, a second etching amount of an etching target film in the second region is greater than a first etching amount of the etching target film in a first region on the front surface of the substrate; and
a second etching step of performing a second etching on the substrate in which the first etching step is subjected, after the first etching step, by ejecting the etching liquid by the nozzle to the front surface of the substrate while rotating the substrate, wherein after the second etching is completed, a fourth etching amount of the etching target film in the second region of the front surface of the substrate is smaller than a third etching amount of the etching target film in the first region of the front surface of the substrate,
wherein the first radial position, the second radial position, and the third radial position are predetermined positions on the front surface of the substrate,
the first radial position is closest to a peripheral edge of the substrate among the first radial position, the second radial position and the third radial position,
the third radial position is closest to a center of the substrate among the first radial position, the second radial position and the third radial position,
the first region is a predetermined circular region provided radially inside the third radial position,
the second region is a predetermined ring-shaped region provided radially outside the third radial position,
the first etching step is performed by moving the nozzle ejecting the etching liquid at a first moving speed between the first radial position and the second radial position, and then moving the nozzle ejecting the etching liquid at a second moving speed higher than the first moving speed between the second radial position and the third radial position,
the first etching step is performed prior to the second etching step, and
the second etching step is performed under a condition in which, by supplying the temperature control liquid to the central portion of the rear surface of the substrate, a temperature of the substrate is higher than a temperature in a case in which the temperature control liquid is not supplied, and a temperature of the first region of the front surface of the substrate becomes higher than a temperature of the second region as the temperature control liquid spreads toward the peripheral edge of the substrate while losing heat to the substrate.

2. The substrate processing method of claim 1, wherein the first etching step is performed under a condition in which the first etching amount of the etching target film in the first region increases toward the peripheral edge of the substrate.

3. The substrate processing method of claim 2, wherein the first etching step is performed while moving a liquid landing position of the etching liquid on the front surface of the substrate from the first radial position to the third radial position.

4. The substrate processing method of claim 1, wherein, in the first etching step, the first etching amount of the etching target film in the first region is zero.

5. The substrate processing method of claim 4, wherein the first etching step is performed in a state in which a liquid film of a protective liquid different from the etching liquid is formed on an entire front surface of the substrate, and the liquid film of the protective liquid prevents the etching liquid from directly landing at least on the first region of the front surface of the substrate.

6. The substrate processing method of claim 5, wherein the protective liquid is pure water.

7. The substrate processing method of claim 1, wherein, in the second etching step, the etching liquid is supplied to the front surface of the substrate in a form of a bi-fluid in which the etching liquid is misted and mixed with a gas, and moving a liquid landing position of the etching liquid on the front surface of the substrate from a center of the front surface of the substrate to the first radial position or from the first radial position to the center of the front surface of the substrate is performed once or more.

8. The substrate processing method of claim 7, wherein, in the second etching step, the temperature of the temperature control liquid supplied to the central portion of the rear surface of the substrate is set to be higher than the temperature at a time point at which the bi-fluid lands on the front surface of the substrate.

9. The substrate processing method of claim 1, wherein the second etching step is performed under a condition in which the fourth etching amount of the etching target film on the front surface of the substrate decreases from the center toward the peripheral edge of the substrate.

\* \* \* \* \*